US012122880B2

(12) United States Patent
Fukui et al.

(10) Patent No.: US 12,122,880 B2
(45) **Date of Patent: *Oct. 22, 2024**

(54) CURABLE ORGANOPOLYSILOXANE COMPOSITION, CURED PRODUCT THEREOF, AND TRANSDUCER AND THE LIKE EQUIPPED WITH SAID CURED PRODUCT

(71) Applicant: Dow Toray Co., Ltd., Tokyo (JP)

(72) Inventors: Hiroshi Fukui, Ichihara (JP); Kyoko Toyama, Ichihara (JP)

(73) Assignee: Dow Toray Co., Ltd., Tokyo (JP)

( * ) Notice: Subject to any disclaimer, the term of this patent is extended or adjusted under 35 U.S.C. 154(b) by 618 days.

This patent is subject to a terminal disclaimer.

(21) Appl. No.: 17/298,081

(22) PCT Filed: Dec. 3, 2019

(86) PCT No.: PCT/JP2019/047211

§ 371 (c)(1),
(2) Date: May 28, 2021

(87) PCT Pub. No.: WO2020/116440

PCT Pub. Date: Jun. 11, 2020

(65) Prior Publication Data

US 2022/0017701 A1 Jan. 20, 2022

(30) Foreign Application Priority Data

Dec. 7, 2018 (JP) ................................ 2018-229640

(51) Int. Cl.

| | |
|---|---|
| ***C08L 83/04*** | (2006.01) |
| ***C08G 77/08*** | (2006.01) |
| ***C08G 77/12*** | (2006.01) |
| ***C08G 77/20*** | (2006.01) |
| ***C08K 3/36*** | (2006.01) |
| ***C08K 9/06*** | (2006.01) |

(52) U.S. Cl.

CPC ............ *C08G 77/20* (2013.01); *C08G 77/08* (2013.01); *C08G 77/12* (2013.01); *C08K 3/36* (2013.01); *C08K 9/06* (2013.01); *C08L 83/04* (2013.01); *C08L 2203/20* (2013.01)

(58) Field of Classification Search

CPC ........ C08G 77/20; C08G 77/08; C08G 77/12; C08K 3/36; C08K 9/06; C08L 83/04; C08L 2203/20; C08L 2205/025; G06F 1/1637; G06F 3/016; G06F 2203/04103; G06F 3/041; G06F 1/1643; G05F 1/1643; H04R 17/005; H04R 17/025; H10N 30/50; H10N 30/857

USPC .......................................................... 524/478

See application file for complete search history.

(56) References Cited

U.S. PATENT DOCUMENTS

| | | | | |
|---|---|---|---|---|
| 4,818,805 | A | 4/1989 | Ikeno et al. | |
| 5,082,706 | A | 1/1992 | Tangney | |
| 5,158,906 | A | 10/1992 | Huang | |
| 5,349,037 | A | 9/1994 | Fujiki et al. | |
| 5,405,929 | A | 4/1995 | Kobayashi | |
| 5,665,794 | A | 9/1997 | Maxson et al. | |
| 11,479,670 | B2 * | 10/2022 | Fukui | C09D 183/08 |
| 11,725,081 | B2 * | 8/2023 | Fukui | B32B 27/283 428/141 |
| 2004/0265599 | A1 | 12/2004 | Ushio et al. | |
| 2005/0038183 | A1 | 2/2005 | Ahn et al. | |
| 2005/0282959 | A1 | 12/2005 | Ahn et al. | |
| 2011/0244226 | A1 | 10/2011 | Seth et al. | |
| 2012/0219794 | A1 | 8/2012 | Seth et al. | |
| 2012/0232219 | A1 | 9/2012 | Shin-Etsu | |
| 2014/0051806 | A1 | 2/2014 | Shin-Etsu | |
| 2014/0175504 | A1 | 6/2014 | Kobayashi et al. | |
| 2014/0179863 | A1 | 6/2014 | Shin-Etsu | |
| 2015/0344671 | A1 | 12/2015 | Furukawa et al. | |

(Continued)

FOREIGN PATENT DOCUMENTS

| | | | |
|---|---|---|---|
| EP | 3892688 | A1 | 10/2021 |
| JP | 63205359 | A | 8/1988 |

(Continued)

OTHER PUBLICATIONS

English translation of International Search Report for PCT/JP2019/047211 dated Mar. 17, 2020, 3 pages.
Machine assisted English translation of JP2011046826 obtained from https://worldwide.espacenet.com on May 25, 2021, 22 pages.
Machine assisted English translation of JP2013241522 obtained from https://worldwide.espacenet.com on May 25, 2021, 11 pages.
Machine assisted English translation of JP2019031600 obtained from https://worldwide.espacenet.com on May 25, 2021, 22 pages.
Machine assisted English translation of WO2020017480 obtained from https://worldwide.espacenet.com on May 25, 2021, 40 pages.
Machine assisted English translation of JP2016108395A obtained from https://patents.google.com/patent on Aug. 23, 2022, 16 pages.
English translation of International Search Report for PCT/JP2018/017480 dated Aug. 7, 2018, 3 pages.

(Continued)

*Primary Examiner* — Hannah J Pak

(74) *Attorney, Agent, or Firm* — WARNER NORCROSS + JUDD LLP

(57) ABSTRACT

A curable organopolysiloxane composition is provided. The composition has relatively low viscosity before curing, can be easily processed into a film shape, and has excellent mechanical strength (e.g., tensile strength, tear strength, elongation, and the like) when, e.g., used as a dielectric layer in a transducer. Other applications are also provided. The composition comprises: (A1, A2) a combination of chain organopolysiloxanes having an alkenyl group only on an end of a molecular chain, and a degree of polymerization within a range of 50 to 550 and a range of 600 to 1000; (B) hydrophobically treated reinforcing silica; (C) a siloxane resin containing an alkenyl group; (D) an organohydrogenpolysiloxane; and (E) a catalyst. The mass ratio of components (A1)/(A2) is within a range of 0.45 to 1.30, and the sum of component (B) and component (C) is within a range of 10 to 25 mass % of the entire composition.

16 Claims, 2 Drawing Sheets

(56) References Cited

U.S. PATENT DOCUMENTS

2016/0215099 A1 7/2016 Enami
2016/0297999 A1 10/2016 Carvajal et al.
2016/0329562 A1 11/2016 Akira et al.
2017/0212287 A1 7/2017 Lee et al.
2017/0260383 A1 9/2017 Fukui et al.
2018/0065347 A1 3/2018 Fukui et al.
2019/0127531 A1 5/2019 Fukui et al.
2022/0064448 A1* 3/2022 Fukui ...................... C08L 83/04
2022/0089840 A1* 3/2022 Fukui ...................... C08K 3/36
2022/0089872 A1* 3/2022 Fukui ...................... B29C 41/003
2023/0015553 A1* 1/2023 Fukui ...................... H01B 19/04
2023/0295432 A1* 9/2023 Fukui ...................... B32B 27/08
524/588

FOREIGN PATENT DOCUMENTS

JP H0718183 A 1/1995
JP H1081825 A 3/1998
JP 2003176462 A 6/2003
JP 2007502345 A 2/2007
JP 2007502346 A 2/2007
JP 2011046826 A 3/2011
JP 2012078144 A 4/2012
JP 2012184350 A 9/2012
JP 2013241522 A 12/2013
JP 2014037507 A 2/2014
JP 2014122271 A 7/2014
JP 2014139292 A 7/2014
JP 2016503108 A 2/2016
JP 2016108395 A 6/2016
JP 2017114983 A 6/2017
JP 2019031600 A 2/2019
WO 2011002101 A2 1/2011
WO 2014105959 A1 7/2014
WO 2015098072 A1 7/2015
WO 2016031242 A1 3/2016
WO 2016098334 A1 6/2016
WO 2016163069 A1 10/2016
WO 2017183541 A1 10/2017
WO 2020017480 A1 1/2020

OTHER PUBLICATIONS

Machine assisted English translation of JP2017114983A obtained from https://patents.google.com on Feb. 17, 2020, 12 pages.
Machine assisted English translation of JP2003176462A obtained from https://patents.google.com on Mar. 17, 2024, 16 pages.
Machine assisted English translation of JP2012078144A obtained from https://patents.google.com on Mar. 17, 2024, 12 pages.
English translation of International Search Report for PCT/JP2019/027836 dated Oct. 8, 2019, 1 page.

* cited by examiner

[FIG. 1]
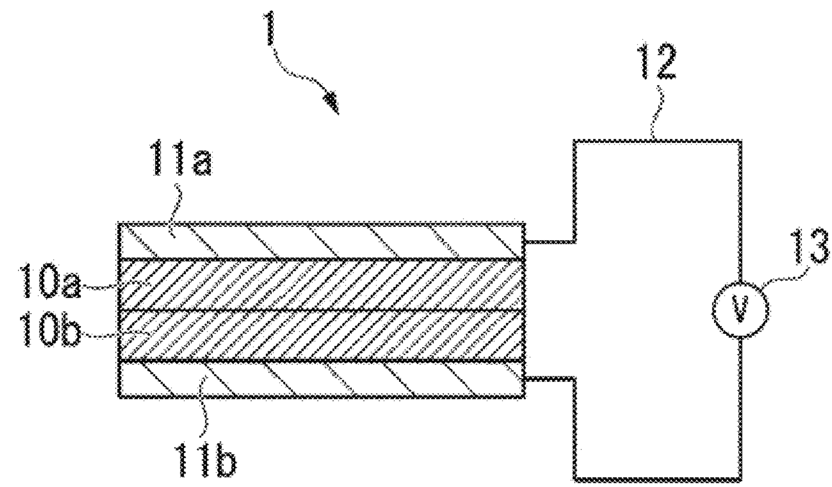
[FIG. 2]
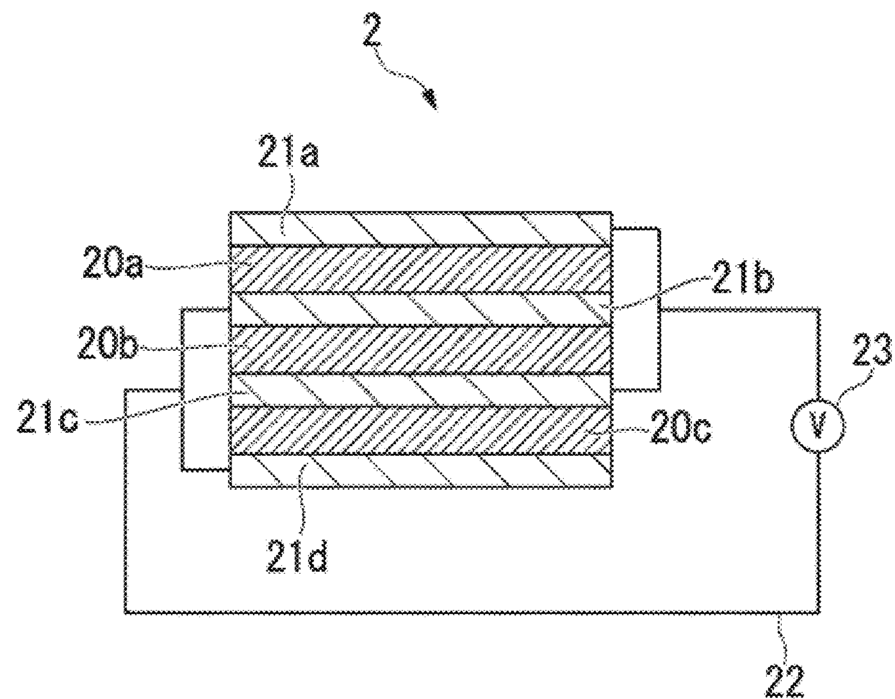

[FIG. 3]
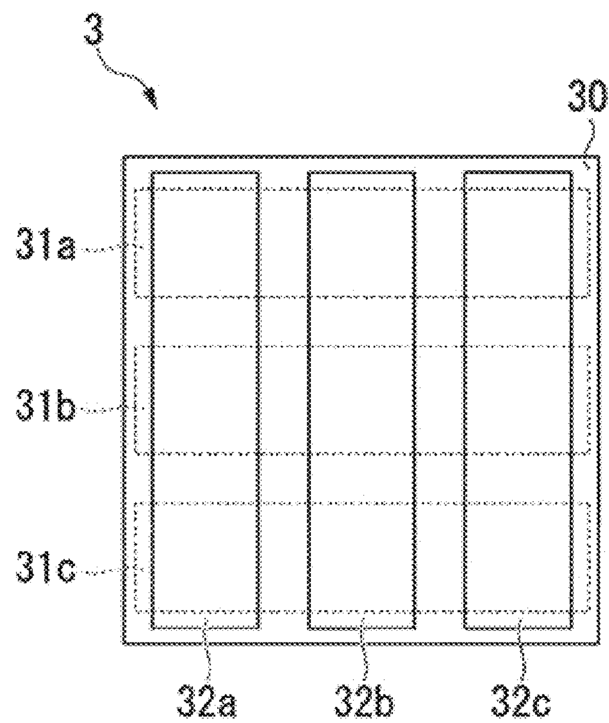
[FIG. 4]
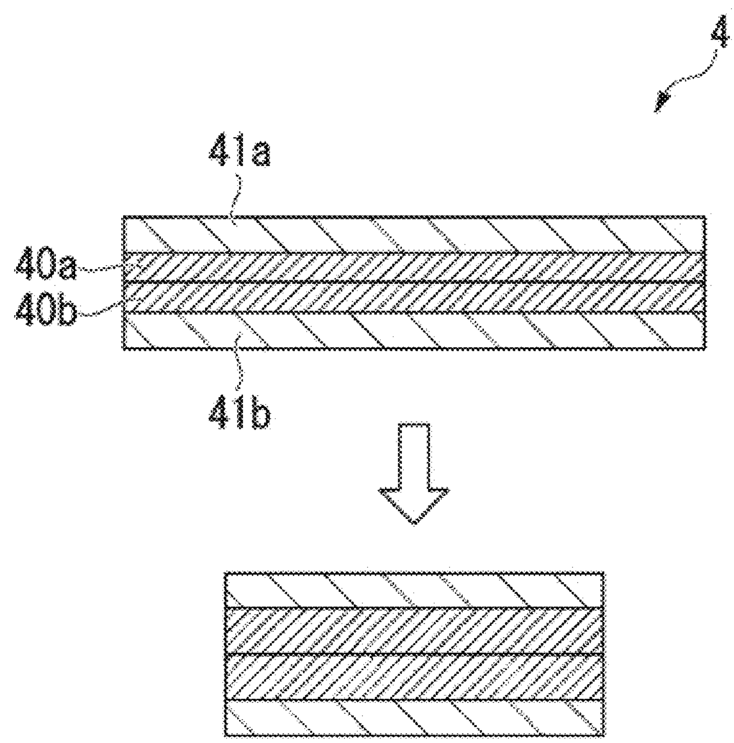

CURABLE ORGANOPOLYSILOXANE COMPOSITION, CURED PRODUCT THEREOF, AND TRANSDUCER AND THE LIKE EQUIPPED WITH SAID CURED PRODUCT

CROSS-REFERENCE TO RELATED APPLICATIONS

This application is the U.S. National Stage of International Application No. PCT/JP2019/047211 filed on 3 Dec. 2019, which claims priority to and all advantages of Japanese Application No. 2018-229640 filed on 7 Dec. 2018, the content of which is incorporated herein by reference.

TECHNICAL FIELD

The present invention relates to a curable organopolysiloxane composition that has relatively low viscosity at room temperature, is easy to make thin, and provides a cured product with excellent mechanical properties such as tear strength and the like, along with a cured product thereof, where the cured product can be suitably used for a dielectric layer such as a transducer or the like as an electroactive silicone material. The present invention further relates to a method for manufacturing an electroactive polymer material using this curable organopolysiloxane composition, along with a transducer member, electronic material, or display apparatus member including the electroactive polymer material, in addition to relating to a transducer, electronic component, or display apparatus using the same.

BACKGROUND ART

Because electroactive silicone materials have mechanical properties and/or electric properties, specifically, a high specific dielectric constant, high dielectric breakdown strength, and a low Young's modulus, allowing for a high energy density to be achieved, in addition to having excellent mechanical strength (specifically, tensile strength, tear strength, elongation percentage, etc.) when used as a dielectric layer in a transducer, durability and a practical displacement amount can be realized while suitably using the electroactive silicone materials as transducer materials. For example, the present applicants disclose that a fluoroalkyl group-containing organopolysiloxane cured product has a high specific dielectric constant and is useful as a transducer material (Patent Document 1 or 2).

Unfortunately, in the field of transducer materials including actuators, there has been recent demand for materials having a low viscosity composition before curing, which can be easily processed into a film shape and further simultaneously achieve both a high specific dielectric constant and mechanical strength regarding electroactive silicone materials, with improved mechanical properties and electric properties strongly desired.

PRIOR ART DOCUMENTS

Patent Documents

[Patent Document 1] WO 2014-105959
[Patent Document 2] WO 2015-098072

SUMMARY OF THE INVENTION

Problems to be Solved by the Invention

In view of the foregoing, an object of the present invention is to provide a curable organopolysiloxane composition, which is a composition that has relatively low viscosity before curing, can be easily processed into a film shape, and excellent mechanical strength (specifically, tensile strength, tear strength, elongation, Young's modulus, and the like) when used as a dielectric layer in a transducer.

Similarly, an object of the present invention is to provide an application of the organopolysiloxane composition as a transducer material such as an actuator or the like.

Means for Solving the Problems

As a result of extensive studies in order to solve the aforementioned problems, the present inventors discovered that the aforementioned problems can be solved by a hydrosilylation reaction curable organopolysiloxane composition, where a combination of a chain organopolysiloxane having an alkenyl group only at an end of a molecular chain and having a high degree of siloxane polymerization and a low degree of siloxane polymerization is used at a specific ratio, the amount of resin and hydrophobically treated reinforcing silica in the entire composition is adjusted within a range of 10 to 20 mass %, and the so-called SiH/Vi ratio (molar ratio) is within a range of 1.0 to 2.5, thereby arriving at the present invention.

A cured product of the curable organopolysiloxane composition can be utilized as an electroactive silicone material having excellent mechanical properties and electric properties, particularly as a film shaped or sheet shaped transducer member.

That is, the first object of the present invention is achieved by:

[1] A curable organopolysiloxane composition, containing:

(A1) straight chain or branched organopolysiloxane having an alkenyl group only at an end of a molecular chain and a degree of siloxane polymerization within a range of 50 to 550;

(A2) straight chain or branched organopolysiloxane having an alkenyl group only at an end of a molecular chain and a degree of siloxane polymerization within a range of 600 to 1000;

(B) hydrophobically treated reinforcing silica;

(C) an organopolysiloxane resin containing an alkenyl group having at least one branched siloxane unit in a molecule with an amount of vinyl (CH2═CH—) groups within a range of 1.0 to 5.0 mass %;

(D) an organohydrogenpolysiloxane having at least three silicon atom-bonded hydrogen atoms in a molecule; and (E) an effective amount of a hydrosilylation reaction catalyst; where the mass ratio of component (A1) to component (A2) (=(A1)/(A2)) is within a range of 0.45 to 1.30, the sum of the components (B) and (C) is within a range of 10 to 25 mass % of the entire composition, the mass ratio of component (C) to the sum of components (B) and (C) (=(C)/{(B)+(C)}) is within a range of 0 to 0.2, and the sum of silicon atom-bonded hydrogen atoms in component (B) is an amount of 0.1 to 2.5 mol with respect to the total amount of 1 mol of an alkenyl group in the composition.

The first object of the present invention is preferably achieved by the following composition:

[2] The curable organopolysiloxane composition according to [1], where the overall viscosity of the composition measured at a shear rate of 0.1 ($S^{-1}$) using a rotational viscometer at 25° C. is within a range of 10 to 150 Pas, and the overall viscosity of the composition measured at a shear rate of 10.0 ($S^{-1}$) is within a range of 10 to 75 Pa·s.

[3] The curable organopolysiloxane composition according to [1] or [2], where the aforementioned component (B) is fumed silica that has been surface treated with a hydrophobizing treatment agent containing at least an organosilicon compound containing an alkenyl group.

[4] The curable organopolysiloxane composition according to any one of [1] to [3], where an organic solvent is essentially not included.

[5] The curable organopolysiloxane composition according to any one of [1] to [3], which is used for forming a transducer member.

The second object of the present invention is achieved by the inventions below, which include a cured product obtained by curing the aforementioned curable organopolysiloxane composition, the use of the cured product as a transducer member, electronic material, or displaying device member, and a transducer containing the cured product.

[6] A cured product, where the curable organopolysiloxane composition according to any one of [1] to [5] is cured.

[7] An electroactive film or electroactive sheet having a thickness of 1 to 200 μm, where the curable organopolysiloxane composition according to any one of [1] to [5] is cured.

[8] A member for a transducer, which is in the form of a film or sheet, where the curable organopolysiloxane composition according to any one of [1] to [5] is cured.

[9] An electronic material or a displaying device member, which is in the form of a film or sheet, where the curable organopolysiloxane composition according to any one of [1] to [5] is cured.

[10] A member for a transducer, which is a gel or elastomer, where the curable organopolysiloxane composition according to any one of [1] to [5] is cured.

[11] A transducer, containing a dielectric layer obtained by curing the curable organopolysiloxane composition according to any one of [1] to [5].

[12] A transducer, where an intermediate layer, which is obtained by curing the curable organopolysiloxane composition according to any one of [1] to [5] or allowing a curing reaction of the composition to partially advance, is interposed between at least a pair of electrode layers.

[13] The transducer according to [11] or [12], where the intermediate layer is a gel or elastomer.

[14] The transducer according to any one of claims 11 to 13, where the intermediate layer is obtained by laminating one or more layers of a cured product obtained by curing the curable organopolysiloxane composition according to any one of [1] to [5].

[15] The transducer according to any one of [11] to [14], which is an actuator.

Effects of the Invention

The present invention can provide a curable organopolysiloxane composition, which is a composition that has relatively low viscosity before curing, can be easily processed into a thin film shape, and excellent mechanical strength (specifically, tensile strength, tear strength, elongation, Young's modulus, and the like) when used as a dielectric layer in a transducer. Furthermore, the curable organopolysiloxane composition is an addition curing type and may or may not contain a high dielectric functional group such as a fluoroalkyl group or the like. Therefore, the curable organopolysiloxane composition has a high degree of freedom in formulation design, is easy to meet various industrial requirements including price and availability, and has sufficient characteristics, curing speed, and the like as an electroactive polymer. Furthermore, an organopolysiloxane cured product of the present invention has a practically sufficient specific dielectric constant and also high mechanical strength (specifically, tensile strength, tear strength, elongation percentage, and the like). Therefore, the organopolysiloxane cured product realizes not only durability but also a practical displacement amount and high responsiveness when molded into a film shape or sheet shape and applied as the dielectric layer, and thus can be preferably used for an application as a transducer material such as an actuator or the like.

BRIEF DESCRIPTION OF THE DRAWINGS

FIG. 1 is a cross sectional view of an actuator 1 according to the present invention when a dielectric layer is laminated.

FIG. 2 is a cross sectional view of an actuator 2 according to the present invention when a dielectric layer and an electrode layer are laminated.

FIG. 3 is a view illustrating the configuration of a sensor 3 according to the present invention.

FIG. 4 is a cross sectional view of a power generation element 4 according to the present invention when a dielectric layer is laminated.

MODE FOR CARRYING OUT THE INVENTION

The fluoroalkyl group-containing curable organopolysiloxane composition according to the present invention will hereinafter be described in detail. The fluoroalkyl group-containing curable organopolysiloxane composition of the present invention contains the following components (A1), (A2), (B), (C), and (D) and another optional component. Each component thereof will first be described.

[Component (A1) and Component (A2)]

Component (A1) and component (A2) are characteristic main agents of the present invention. Component (A1) is a chain organopolysiloxane having an alkenyl group only at an end of a molecular chain, and component (A2) is the organopolysiloxane having a relatively low degree of siloxane polymerization. By combining these components within a specific mass ratio range, it is possible to provide a curable organopolysiloxane composition that is suitable in terms of the overall viscosity of the composition, the curability of the composition, and the mechanical properties of the cured material, which affect the film processability of the composition. Note that the degree of siloxane polymerization of these components can be determined by the integrated ratio of peak intensities using $^{29}$Si NMR.

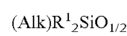

$(Alk)R^1_2SiO_{1/2}$ (where Alk represents an alkenyl group having two or more carbon atoms) at an end of a molecular chain and where other siloxane units are essentially only a siloxane unit expressed by $R^2_2SiO_{2/2}$.

Note that components (A1) and (A2) may be branched organopolysiloxanes in which a linear siloxane structure is branched by having less than two $R^3SiO_{3/2}$ unit (trifunctional siloxy unit, R represents a monovalent organic group) or $SiO_2$ unit (tetrafunctional siloxy unit) branched siloxane units in a molecule, but are preferably straight chain organopolysiloxanes where both ends of a molecular chain are blocked by siloxane units as expressed by $(Alk)R^2_2SiO_{1/2}$.

Components (A1) and (A2) contain two or more carbon atoms, and preferably an alkenyl group having 2 to 20 carbon atoms, on an end of a molecular chain. Examples thereof include vinyl groups, allyl groups, butenyl groups, pentenyl groups, hexenyl groups, heptenyl groups, octenyl groups, nonenyl groups, decenyl groups, undecenyl groups, and dodecenyl groups. From the perspective of economy and reactivity, the alkenyl group is preferably a vinyl group, an allyl group, a hexenyl group, and an octenyl group, and a vinyl group and a hexenyl group is more preferably used.

Other silicon atom-bonded functional groups in component (A1) and component (A2) are not particularly limited. However, examples include groups selected from monovalent hydrocarbon groups, hydroxyl groups, and alkoxy groups, having no carbon-carbon double bond, which is the aforementioned R1, and more specific examples include alkyl groups having 1 to 12 carbons atoms, aryl groups having 6 to 20 carbon atoms, aralkyl groups having 7 to 20 carbon atoms, hydroxyl groups, and alkoxy groups having 1 to 6 carbon atoms. As an alkyl group having a carbon number of 1 to 12, a methyl group is preferable, taking economy and heat resistance into consideration. As an aryl group having a carbon number of 6 to 20, a phenyl group, methylphenyl(tolyl) group, and a naphthyl group are preferable in terms of economy. A benzyl group and a phenethyl group are preferably used as an aralkyl group having a carbon number of 7 to 20. A methoxy group, an ethoxy group, and an n-propoxy group are further preferable as an alkoxy group having a carbon number of 1 to 6. Note that a certain amount or more of all substituent groups on silicon atoms in component (A) are the fluoroalkyl group, with two or more alkenyl groups having a carbon number of 2 to 12 per molecule, while other silicon atom-bonded functional groups are preferably a methyl group, a phenyl group, or a hydroxyl group, and are particularly preferably selected from a methyl group and a phenyl group.

Optionally, a portion or all of components (A1) and (A2) may contain a high dielectric functional group. Examples of high dielectric functional groups include: a) halogen atoms and groups containing a halogen atom as represented by 3,3,3=trifluoropropyl groups and the like; b) groups containing a nitrogen atom as represented by cyanopropyl groups and the like; c) groups containing an oxygen atom as represented by carbonyl groups and the like; d) heterocyclic groups such as imidazole groups and the like; e) groups containing a boron atom such as borate ester groups and the like; f) groups containing phosphorus such as phosphine groups and the like; and g) groups containing a sulfur atom such as thiol groups and the like. These high dielectric functional groups may be 5 mol % or more, preferably 20 mol % or more, and more preferably 40 mol % or more of all substitution groups on the silicon atom. However, in the composition of the present invention (including component (A1) and component (A2)), a high dielectric functional group such as a 3,3,3-trifluoropropyl group or the like is an optional functional group, and even without these functional groups, a curable organopolysiloxane composition can be provided, which can form an electroactive film or electroactive sheet can be provided, having sufficient practicality, a transducer member or the like with sufficient practicality.

The degree of siloxane polymerization of component (A1), including terminal siloxane units, is within a range of 50 to 550, a range of 50 to 500, a range of 75 to 450, and particularly preferably within a range of 100 to 400. Since component (A1) has a relatively low viscosity and rapid curing reactivity, combined use with (A2) component can reduce the overall viscosity without impairing the curability or the like of the composition. On the other hand, if the range of the degree of siloxane polymerization of component (A1) is less than the lower limit described above, the curability and mechanical strength of the entire composition may be insufficient. Furthermore, if the range of the degree of siloxane polymerization of component (A1) exceeds the upper limit described above, it may become indistinguishable from that of component (A2), and the technical effects of the present invention, such as a reduction in viscosity when the two are used together, may be insufficient.

The degree of siloxane polymerization of component (A2), including terminal siloxane units, is within a range of 600 to 1000, a range of 650 to 1000, a range of 700 to 1000, and particularly preferably within a range of 750 to 950. Such component (A2), when used in combination with another component, provides excellent mechanical properties to a cured product and has rapid curing reactivity. On the other hand, if component (A2) alone is used, the overall viscosity of the composition is high, and in particular, thin membrane/thin film processability is insufficient. However, by using component (A2) together with component (A1), the overall viscosity can be reduced without impairing the curability and the like of the composition, and the film processability and the like can be improved. On the other hand, if the range of the degree of siloxane polymerization of component (A2) is less than the lower limit described above, the curability and mechanical strength of the entire composition may be insufficient. Furthermore, if the range of the degree of siloxane polymerization of component (A2) exceeds the upper limit described above, the overall viscosity of the composition will be high, and technical effects such as film processability may not be achieved even when used in combination with component (A1) at a specific mass ratio.

In order to ensure the mechanical properties of a cured product and to keep the viscosity of the entire composition low, the mass ratio of component (A1) to component (A2) (=(A1)/(A2)) is within a range of 0.45 to 1.30, preferably a range of 0.55 to 1.20, and more preferably a range of 0.60 to 1.15. If the mass ratio of (A1)/(A2) is less than the lower limit described above, the ratio of the component (A2) is high, the overall viscosity may be high, and film processability may deteriorate. On the other hand, if the mass ratio of (A1)/(A2) exceeds the upper limit described above, the ratio of component (A2) may be low, and the mechanical properties of a cured product may be insufficient.

[Component (B)]

Component (B) is a reinforcing silica added to improve the mechanical strength of a cured product, and examples thereof include fumed silica, wet silica, and milled silica having an average primary particle diameter of less than 50 nm. Preferable examples thereof include hydrophobic fumed silica with an average primary particle diameter that is 10 nm or less, which are partially aggregated, and with a specific surface area of 50 $m^2/g$ or more and 300 $m^2/g$ or less, from the perspective of improving mechanical strength.

Component (B) of the present invention must be hydrophobically treated, and the hydrophobically treated reinforcing silica can be dispersed in the organopolysiloxane composition at a high filling ratio. Therefore, increase in viscosity of the composition is suppressed, and film molding processability is improved. If reinforcing silica or other reinforcing inorganic particles that have not been hydrophobically treated are used, sufficient viscosity suppression cannot be achieved even when used in combination with the aforementioned components, and film molding processability may deteriorate.

Examples of a hydrophobic surface treating agent used in component (B) include at least one surface treating agent selected from a group consisting of organic titanium compounds, organic silicon compounds, organic zirconium compounds, organic aluminum compounds, and organic phosphorus compounds. The surface treating agent may be used independently or two or more types may be used in combination. Of the surface treating agents, an organic silicon compound and particularly silazanes, silanes, siloxanes, and polysiloxanes are preferably used, and those with a silazane, alkyltrialkoxysilane, or trialkoxysilylpolydimethylsiloxane at one end are most preferably used. The surface treatment can be performed by treating (or coating) the reinforcing silica with a surface treating agent.

In component (B), the amount of the surface treating agent for hydrophobization is preferably within a range of 0.1 mass % or higher and 10 mass % or less, and more preferably within a range of 0.3 mass % or higher and 5 mass % or less. Note that the treatment amount is preferably the feed ratio of inorganic particles to the surface treating agent, and excess treating agents are preferably removed after treatment.

When component (B) is used, the dynamic strength and dielectric breakdown strength of the organopolysiloxane cured product (hereinafter, simply referred to as "cured product") obtained by curing the composition according to the present invention. The added amount of reinforcing inorganic fine particles is preferably within a range of 0.1 to 30 mass %, and more preferably 0.1 to 10 mass %, with regard to the curable organopolysiloxane composition. If the adding amount is outside the aforementioned preferable range, the effects obtained by adding inorganic particles may not be obtained or the moldability of the curable organopolysiloxane composition may be reduced.

[Component (C)]

Component (C) is an arbitrary configuration of the present invention, and is an organopolysiloxane resin containing an alkenyl group having at least one branched siloxane unit in a molecule with an amount of vinyl (CH2═CH—) groups within a range of 1.0 to 5.0 mass %.

An example thereof includes an organopolysiloxane resin containing an alkenyl as expressed by Average unit formula:

$$(RSiO_{3/2})o(R_2SiO_{2/2})p(R_3SiO_{1/2})q(SiO_{4/2})r(XO_{1/2})s$$

In the formula, R represents a monovalent organic group, and X represents a hydrogen atom or an alkyl group with 1 to 3 carbon atoms. However, of all Rs, R is an alkenyl group at least in a range where the amount of vinyl (CH2═CH—) groups in the organopolysiloxane resin satisfies a range of 1.0 to 5.0 mass %, and at least a portion of Rs in the siloxane unit expressed by $RSiO_{1/2}$ are particularly preferably alkenyl groups.

In the formula, t represents an integer within a range of 5 to 1,000. Furthermore, in the formula, (o+r) is a positive integer, p is 0 or a positive integer, q is 0 or a positive integer, s is 0 or a positive integer, p/(o+r) is a number within a range of 0 to 10, q/(o+r) is a number within a range of 0 to 5, (o+r)/(o+p+q+r) is a number within a range of 0.3 to 0.9, and s/(o+p+q+r) is a number within a range of 0 to 0.4.

A particularly preferable example of component (a2) includes an MQ organopolysiloxane resin containing an alkenyl group expressed by

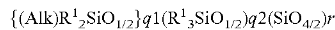

$$\{(Alk)R^1{}_2SiO_{1/2}\}q1(R^1{}_3SiO_{1/2})q2(SiO_{4/2})r$$

(where Alk and $R^2$ represent the same groups as described above, q1+q2+r is a number within a range of 50 to 500, (q1+q2)/r is a number within a range of 0.1 to 2.0, and q2 is a number of a range where the number of vinyl (CH2═CH—) groups in the organopolysiloxane resin satisfies a range of 1.0 to 5.0).

By combining component (A1) and component (A2), which are straight chain organopolysiloxanes having alkenyl groups only at ends of a molecular chain, with component (C), which is an organopolysiloxane resin and has a certain amount of alkenyl groups, a composition can be provided, which provides a cured reactant with excellent curing reactivity and excellent mechanical strength and flexibility as the whole composition. However, component (C) may not be used so long as the amount used is within a range of amounts of component (B) and component (C) described below.

[Amount of Component (B) and Component (C) Used]

In the composition of the present invention, the sum of the components (B) and (C) must be within a range of 10 to 25 mass % of the entire composition, and the mass ratio of component (C) to the sum of components (B) and (C) (=(C)/{(B)+(C)}) must be within a range of 0 to 0.2, from the perspective of achieving sufficient mechanical properties. Note that the value of (C)/{(B)+(C)} may be 0, and the composition of the present invention may not contain component (C).

The sum of the component (B) and component (C) described above is the sum of the reinforcing silica and the organopolysiloxane resin containing an alkenyl group and is within a range of 10 to 25 mass %, and more preferably within a range of 12.5 to 22.5 mass %. These components, and particularly component (B), are components that improve the mechanical strength of a cured product of the composition according to the present invention, and if the amount used is less than the lower limit described above, the cured product of the composition according to the present invention may not achieve sufficient mechanical strength. On the other hand, if the amount used exceeds the upper limit described above, the flexibility of the cured product decreases, and thus use as an electroactive polymer film or the like may not be possible when molded into a film or the like.

The mass ratio of component (C) to the sum of components (B) and (C) is within a range of 0 to 0.2, and the use of component (B) alone or a mixture with component (C) primarily containing component (B) is preferred. Note that when component (C) is used in combination, use at an amount that is within the aforementioned range may further improve flexibility, film formability, and the like of the cured product of the composition according to the present invention as compared to component (B) alone.

[Component (D)]

Component (D) is an organohydrogenpolysiloxane having at least three silicon atom-bonded hydrogen atoms in a molecule and is a component that functions as a crosslinking agent for components (A1), (A2), and (C).

Examples of component (D) include 1,1,3-3-tetramethyldisiloxane, 1,3,5,7-tetramethyl cyclotetrasiloxane, tris(dimethylhydrogensiloxy)methylsilane, tris(dimethylhydrogensiloxy)phenylsilane, methylhydrogenpolysiloxanes blocked at both ends of a molecular chain with a trimethylsiloxy group, dimethylsiloxane/methylhydrogensiloxane copolymers blocked at both ends of a molecular chain with a trimethylsiloxy group, dimethylpolysiloxane blocked at both ends of a molecular chain with a dimethylhydrogensiloxane group, dimethylsiloxane/methylhydrogensiloxane copolymers blocked at both ends of a molecular chain with a dimethylhydrogensiloxane group, methylhydrogensiloxane/diphenylsiloxane copolymers blocked at both ends of a molecular chain with a trimethylsiloxy group, methylhydrogensiloxane/diphenylsiloxane/dimethylsiloxane copolymers blocked at both ends of a molecular chain with a trimethylsiloxy group, hydrolytic condensates of a trimethylsilane, copolymers containing $(CH_3)_2HSiO_{1/2}$ units and $SiO_{4/2}$ units, copolymers containing $(CH_3)_2HSiO_{1/2}$ units, $SiO_{4/2}$ units, and $(C_6H_5)SiO_{3/2}$ units, copolymers containing $(CH_3)_2HSiO_{1/2}$ units and $CH_3SiO_{3/2}$ units, and mixtures of two or more types thereof.

A portion or all of component (D) may contain a high dielectric functional group. The type and amount of the high dielectric functional group are the same as those illustrated in component (A1) and component (A2). Component (D) may also be an organohydrogen polysiloxane resin, a portion of which is a copolymer containing a $(CH_3)_2HSiO_{1/2}$ unit and $SiO_{4/2}$ unit, which may further have a high dielectric functional group.

[Amount of Component (D) Used]

The amount of component (D) used in the composition of the present invention is an amount such that the total sum of silicon atom-bonded hydrogen atoms in the component is 1.0 to 2.5 mol with respect to the total amount 1 mol of an alkenyl group in the composition. Herein, the alkenyl group in the composition is mainly derived from component (A1), component (A2), component (C), and the like. If the amount of component (D) used is less than the aforementioned lower limit, the present composition may be insufficiently cured. In contrast, if the amount of component (D) used exceeds the aforementioned upper limit, when the composition of the present invention is cured, an elastic gel or an elastic elastomer may not be obtained, and in particular, the mechanical strength may be insufficient. A more preferred amount of component (D) used is an amount such that silicon atom-bonded hydrogen atoms in the present component are 0.2 to 2.00 mol, 0.2 to 1.80 mol, 0.25 to 1.75 mol, and more preferably 0.35 to 1.50 mol, with respect to the total amount of 1 mol of an alkenyl group in the composition.

[Component (E)]

A hydrosilylation reaction catalyst serving as component (E) is not limited to a specific catalyst, so long as a hydrosilylation reaction can be promoted. Many metals and compounds are currently known as hydrosilylation reaction catalysts, which can be appropriately selected and used in the present invention. Specific examples of the hydrosilylation reaction catalyst can include fine particulate platinum adsorbed on silica fine powder or a carbon powder carrier, chloroplatinic acids, alcohol-modified chloroplatinic acids, olefin complexes of a chloroplatinic acid, coordinate compounds of a chloroplatinic acid and vinyl siloxane, a platinum-alkenyl siloxane complex, a platinum-olefin complex, a platinum-carbonyl complex, platinum black, palladium, and rhodium catalysts. In particular, 1,3-divinyl-1,1,3,3-tetramethyldisiloxane is preferable because the platinum-alkenyl siloxane complex has good stability. In addition, from the perspective of improving handling workability and pot life of the composition, these hydrosilylation reaction catalysts may be thermoplastic resin particles containing a hydrosilylation reaction catalyst, which are catalysts dispersed or encapsulated in a thermoplastic resin such as a silicone resin, a polycarbonate resin, an acrylic resin, or the like, and particularly may be a thermoplastic resin particles containing a hydrosilylation reaction catalyst that contains platinum. As the catalyst for promoting the hydrosilylation reaction, a non-platinum based metal catalyst such as iron, ruthenium, iron/cobalt, or the like may be used.

The amount of a catalyst used for a hydrosilylation reaction is an effective amount but is not particularly limited as long as it promotes the curing of the curable organopolysiloxane composition according to the present invention. Specifically, in mass units, metal atoms in the catalyst are of an amount within a range of 0.01 to 1,000 ppm, and preferably, the platinum metal atoms in component (E) are of an amount within a range of 0.1 to 500 ppm, with regard to the sum (100 mass % as a whole) of components (A1) to (D). This is because, when the amount of component (E) is less than the lower limit within the aforementioned range, curing may be insufficient; in contrast, if the amount exceeds the aforementioned upper limit, it is generally uneconomical.

[(F) Hydrosilylation Reaction Inhibitor]

A hydrosilylation reaction inhibitor is an arbitrary component which is blended to inhibit a crosslinking reaction from occurring between components (A1), (A2), and (C) and component (D), extend work life at normal temperatures, and improve storage stability.

Therefore, for practical purposes, the curable composition according to the present invention is a preferable component when necessarily blended.

Examples of the hydrosilylation reaction inhibitor include acetylenic compounds, ene-yne compounds, organic nitrogen compounds, organic phosphorus compounds, and oxime compounds. Specific examples include: alkyne alcohols such as 3-methyl-1-butyne-3-ol, 3,5-dimethyl-1-hexyne-3-ol, 3-methyl-1-pentyne-3-ol, 1-ethynyl-1-cyclohexanol, phenyl butanol, and the like; ene-yne compounds such as 3-methyl-3-pentene-1-yne, 3,5-dimethyl-1-hexyne-3-yne, and the like; methylalkenylcyclosiloxanes such as 1,3,5,7-tetramethyl-1,3,5,7-tetravinylcyclotetrasiloxane, 1,3,5,7-tetramethyl-1,3,5,7-tetrahexenylcyclotetrasiloxane, and the like; as well as benzotriazoles.

The blending amount of the hydrosilylation reaction inhibitor is an amount to effectively extend the work life at normal temperatures of the curable organopolysiloxane composition of the present invention and improve the storage stability. Normally, the amount is within a range of 0.001 to 5 mass % and preferably within a range of 0.01 to 2 mass % per 100 mass % of the sum of components (A1) and (A2), but may be appropriately selected in accordance with the type of the present component, the performance and content of a platinum based catalyst, the amount of an alkenyl group in the composition, the amount of silicon atom-bonded hydrogen atoms in component (B), and the like.

[Other Fillers]

In the composition according to the present invention, a filler other than component (B) may or may not be used as required. The type of the other filler is not particularly limited, and examples include high dielectric fillers, conductive fillers, insulating fillers, and reinforcing fillers other than component (B). One or more types thereof can be used. Note that a portion or all of the other filler may be surface treated with one or more surface treating agents, similar to component (B). Note that the inorganic fine particles simultaneously have two or more functions including functioning as a reinforcing filling material, or the like.

Examples of preferred dielectric inorganic fine particles include one or more inorganic fine particles selected from a group consisting of composite metal oxides where a portion of barium and titanium sites of titanium oxide, barium titanate, strontium titanate, lead zirconate titanate, and barium titanate is substituted with calcium, strontium, yttrium, neodymium, samarium, dysprosium, or other alkaline earth metal, zirconium, or rare earth metals. Titanium oxide, barium titanate, zirconate titanate barium calcium, and strontium titanate are more preferable, and titanium oxide and barium titanate are even more preferable.

In particular, at least a portion of the dielectric inorganic fine particles are particularly preferably dielectric inorganic fine particles with a specific dielectric constant at room temperature at 1 kHz of 10 or more. Note that the upper limit of the preferable size (average primary particle size) of the inorganic fine particles is 20,000 nm (20 μm), but more preferably 10,000 nm (10 μm), when considering the processability into a thin film for a transducer described later. Using the dielectric inorganic fine particles may further improve the mechanical properties and/or the electrical properties, and particularly the specific dielectric constant, of the organopolysiloxane cured product.

The conductive inorganic fine particles are not particularly limited so long as conductivity can be applied to the organopolysiloxane cured product. Specific examples thereof include: conductive carbon black, graphite, vapor phase growth carbon (VGCF), and other conductive carbons; and metal powders of platinum, gold, silver, copper, nickel, tin, zinc, iron, aluminum, and the like. Further examples include: antimony-doped tin oxide, phosphorous-doped tin oxide, needle shaped titanium oxide the surface of which is coated with tin oxide/antimony, tin oxide, indium oxide, antimony oxide, zinc antimonate, and pigments obtained by coating tin oxide, and the like on a whisker surface of carbon or graphite; pigments obtained by coating at least one conductive metal oxide selected from a group consisting of tin-doped indium oxide (ITO), fluorine-doped tin oxide (FTO), phosphorous-doped tin oxide, and nickel oxide; pigments having conductivity containing tin oxide and phosphorus on the surface of titanium dioxide particles; and the like. These may be treated with the various surface treating agents described later. These may be used independently, or two or more may be used in combination.

Furthermore, the conductive inorganic fine particles may be obtained by coating a conductive material such as a metal or the like on the surface of fibers such as glass fibers, silica alumina fibers, alumina fibers, carbon fibers, and the like, needle shaped reinforcing materials such as aluminum borate whiskers, potassium titanate whiskers, and the like, or inorganic filling materials such as glass beads, talc, mica, graphite, wollastonite, dolomite, and the like.

Insulating inorganic fine particles that can used in the present invention are not limited so long as the insulating inorganic materials are generally known, in other words, particles of inorganic materials having a volume resistivity of 1010 to 1018 Ω·cm. The shape thereof can be any shape such as a particle shape, flake shape, or fiber shape (including whiskers). Specific examples thereof include ceramic spherical particles, plate shaped particles, and fibers. Preferably used examples thereof include metal silicates such as alumina, iron oxide, copper oxide, mica, talc, and the like, and particles such as quartz, amorphous silica, glass, and the like. Furthermore, these may be treated with various surface treating agents described later. These may be used independently, or two or more may be used in combination. When the insulating inorganic fine particles are added to the composition, the dynamic strength and dielectric breakdown strength of the organopolysiloxane cured product can be increased, and an increase in the specific dielectric constant may also be observed.

The amount of the insulating inorganic particles added is preferably within a range of 0.1 to 20 mass %, and more preferably 0.1 to 5 mass %, with regard to the curable organopolysiloxane composition, based on the application. If the added amount is outside the aforementioned preferred range, the effect of adding may not be obtained, or the dynamic strength of the organopolysiloxane cured product may be reduced.

Examples of thermally conductive inorganic fine particles that can be used in the present invention include: metal oxide particles such as magnesium oxide, zinc oxide, nickel oxide, vanadium oxide, copper oxide, iron oxide, silver oxide, and the like; and inorganic compound particles such as aluminum nitride, boron nitride, silicon carbide, silicon nitride, boron carbide, titanium carbide, diamond, diamond-like carbon, and the like. Zinc oxide, boron nitride, silicon carbide, and silicon nitride are preferable. When one or more of the thermally conductive inorganic fine particles is added to the composition, the thermal conductivity of the organopolysiloxane cured product can be increased.

The average particle size of the inorganic particles can be measured by a normal measurement method that is used in the field. For example, if the average particle size is approximately 50 nm or larger and 500 nm or less, the particle size is measured by observation using a microscope such as a transmission type electron microscope (TEM), a field emission type transmission electron microscope (FE-TEM), a scanning type electron microscope (SEM), a field emission type scanning electron microscope (FE-SEM), or the like, such that the average value can be obtained as a measure of the average primary particle size. On the other hand, if the average particle size is approximately 500 nm or more, the value of the average primary particle size can be directly obtained using a laser diffraction/scattering type particle size distribution measuring device or the like.

[Other Optional Components]

The curable organopolysiloxane composition according to the present invention can contain an additive, adhesion improving agent, or the like in order to further improve mold releasability or dielectric breakdown properties.

A film-like or sheet-like cured product obtained by curing the curable organopolysiloxane composition according to the present invention into a thin film can be preferably utilized for an adhesive film and an electroactive film (dielectric layer or electrode layer) forming a transducer. However, if the mold releasability of the cured layer is inferior when forming a thin film, when an organopolysiloxane cured film is manufactured at a particularly high speed, the film may be damaged due to mold releasing. Furthermore, in a dielectric layer used in an actuator, touch panel, or the like, the adhesion may need to be reduced in order to improve sensitivity at low pressure. The curable organopolysiloxane composition of the present invention can improve the manufacturing speed of the film without damaging the film, and the pressure-sensitive adhesion may be further reduced by adding another mold release agent.

Examples of mold releasability improving additives (mold release agents) that can be applied to the curable organopolysiloxane composition of the present invention include carboxylic acid based mold release agents, ester based mold release agents, ether based mold release agents, ketone based mold release agents, alcohol based mold release agents, and the like. One type thereof may be used independently, or two or more types thereof may be used in combination. Furthermore, examples of the mold release agents that can be used include mold release agents not containing silicon atoms, mold release agents containing silicon atoms, and mixtures thereof. Specific example include those proposed in the aforementioned WO2014/105959.

The dielectric breakdown properties improving agent is preferably an electrical insulation improving agent and can be selected from a group consisting of hydroxides and salts of aluminum or magnesium, clay mineral, and mixtures thereof, specifically, aluminum silicate, aluminum sulfate, aluminum hydroxide, magnesium hydroxide, fired clay, montmorillonite, hydrotalcite, talc, and mixtures thereof. Furthermore, the insulation improving agent may be treated by a known surface treatment method. Specific example include those proposed in the aforementioned WO2014/105959.

The adhesion improving agent is for improving adhesion to a substrate where the curable organopolysiloxane composition of the present invention is in contact during curing. If the dielectric layer serving as the cured product of the composition will not be re-peeled, it will be an effective additive. Examples of adhesion improving agents include vinyltriethoxysilane, allyltrimethoxysilane, allyltriethoxysilane, 3-glycidoxypropyltrimethoxysilane, 3-methacryloxypropyltrimethoxysilane, and other organic functional alkoxysilane compounds, and siloxane derivatives thereof, particularly chain or three dimensional resinous siloxane derivatives substituted with an organic group containing fluorine. Particularly preferred examples of the adhesion improving agent include one or more types selected from:

(g1) reaction mixtures between an organoalkoxysilane containing an amino group and organoalkoxysilane containing an epoxy group;

(g2) organic compounds having at least two alkoxysilyl groups in one molecule, in addition to containing a bond other than a silicon-oxygen bond between these silyl groups;

(g3) silanes containing an epoxy group as expressed by general formula:

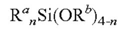

$R^a_nSi(OR^b)_{4-n}$ (wherein, $R^a$ represents an organic group containing a monovalent epoxy group, Rb represents an alkyl group having a carbon number of 1 to 6, or a hydrogen atom. n represents a number within a range of 1 to 3), or a partially hydrolyzed condensate thereof; and (g4) an alkoxysilane (except those having an organic group containing an epoxy group), or a partially hydrolyzed condensate thereof;

and the like.

So long as a technical effect of the present invention is not impaired, examples of other optional components include: phenol based antioxidants, quinone based antioxidants, amine based antioxidants, phosphorus based antioxidants, phosphite based antioxidants, sulfur based antioxidants, thioether based antioxidants, and other antioxidants; triazole based light stabilizers, benzophenone based light stabilizers, and other light stabilizers; phosphoric ester based flame retardants, halogen based flame retardants, phosphorus based flame retardants, antimony based flame retardants, and other flame retardants; one or more antistatic agents including cation based surfactants, anion based surfactants, nonionic surfactants, and the like; dyes; pigments; and the like.

[Optional Solvents]

While the curable organopolysiloxane composition of the present invention can be directly subjected to a curing reaction, an organic solvent can be used as required in order to improve the miscibility and handleability, if the composition is in a solid state or a viscous liquid state. In particular, if the curable organopolysiloxane composition of the present invention is coated in a film shape, a solvent is preferably used to adjust the viscosity such that the overall viscosity is within a range of 100 to 10,000 mPa·s. Moreover, if diluted with a solvent, the composition can be used within a range of 0 to 2000 mass parts with respect to the sum of the aforementioned solid content (100 mass parts). That is, in the present invention composition, the solvent may be 0 parts by mass. Note that the curable organopolysiloxane composition of the present invention can be designed to be solvent-free because the combination of component (A1) and component (A2) is selected, and no fluorine based solvent, organic solvent, and the like remain in the film obtained after curing. This has the advantage of eliminating environmental load problems and the effects of solvents on electronic devices.

The type of organic solvent used herein is not particularly limited, so long as the solvent is a compound capable of dissolving all or a portion of the components of the composition. A type having a boiling point of 80° C. or higher and less than 200° C. is preferably used. Examples include i-propyl alcohol, t-butyl alcohol, cyclohexanol, cyclohexanone, methyl ethyl ketone, methyl isobutyl ketone, toluene, xylene, mesitylene, 1,4-dioxane, dibutyl ether, anisole, 4-methyl anisole, ethyl benzene, ethoxy benzene, ethylene glycol, ethylene glycol dimethyl ether, ethylene glycol diethyl ether, 2-methoxy ethanol (ethylene glycol monomethyl ether), diethylene glycol dimethyl ether, diethylene glycol monomethyl ether, 1-methoxy-2-propyl acetate, 1-ethoxy-2-propyl acetate, octamethyl cyclotetrasiloxane, hexamethyl disiloxane, and other non-halogen solvents, trifluoromethyl benzene, 1,2-bis (trifluoromethyl) benzene, 1,3-bis (trifluoromethyl) benzene, 1,4-bis (trifluoromethyl) benzene, trifluoromethyl chlorobenzene, trifluoromethyl fluorobenzene, hydrofluoroethers, and other halogen solvents. The organic solvent can be used independently or as a mixture of two or more types thereof. As the content of fluoroalkyl groups in the curable composition increases, the ratio of the abovementioned halogen based solvent used must be increased.

[Overall Viscosity of the Composition]

From the perspective of the aforementioned film processability, the viscosity of the composition at 25° C. is preferably within a range of a viscosity that enables the present composition to be coated on a thin film. Moreover, the overall viscosity of the composition measured at a shear rate of 0.1 ($S^{-1}$) using a rotational viscometer at 25° C. is particularly preferably within a range of 10 to 150 Pa·s, and the overall viscosity of the composition measured at a shear rate of 10.0 ($S^{-1}$) is particularly preferably within a range of 10 to 75 Pas. Since the composition of the present invention can be made with such a low viscosity and solvent-free composition, the composition is particularly preferable for manufacturing a thin film or the film, which is an electroactive film or electroactive sheet having a thickness of 1 to 200 μm.

The curable organopolysiloxane composition of the present invention can be prepared by uniformly mixing each of the aforementioned components. Mixing at ambient temperature may be performed using various stirrers or kneaders. Mixing under heat may be performed when combining components that are not cured during mixing. Moreover, when it comes to mixing, an extruder or kneader (more specifically, one or more mechanical means selected from a biaxial extruder, biaxial kneader, and uniaxial blade type extruder) may be used for kneading and manufacturing. Specifically, in the present invention, the reactive organopolysiloxane component, a filler, and the surface treating agent may be kneaded using a biaxial extruder having a free volume of 5,000 (L/hour) or more to form a silicone gum compound (master batch) containing a high concentration of inorganic fine particles (for example, 80 mass % or more), after which other reactive organopolysiloxane components, curing catalysts, and other components may be added and knead to manufacture a curable organopolysiloxane composition.

So long as curing does not occur during mixing, the adding order of the components is not particularly limited. If the components are not immediately used after mixing, they are preferably separated and stored in multiple containers such that components (B) and (C) are not present in the same container, after which, immediately prior to use, components in all containers are preferably mixed.

The curing reaction of the fluoroalkyl group-containing curable organopolysiloxane composition according to the present invention is normally achieved by heating this composition or exposing this composition to active energy rays. The curing reaction temperature by heating is not particularly limited, but is preferably 50° C. or higher and 200° C. or lower, more preferably 60° C. or higher and 200° C. or lower, and even more preferably 80° C. or higher and 180° C. or lower. Furthermore, the time for the curing reaction is dependent on the structure of the aforementioned components (A), (B), and (C) and is normally 1 second or more and 3 hours or less. Generally, the cured product can be obtained by maintaining for 10 second to 30 minutes within a range of 90 to 180° C.

Examples of active energy rays that may be used in the curing reaction include ultraviolet rays, electron beams, radiation, and the like. Ultraviolet rays are preferable from the perspective of practicality. If the curing reaction is performed using ultraviolet rays, a catalyst for the hydrosilylation reaction having high activity to ultraviolet rays is used, for example, a bis(2,4-pentanedionato)platinum complex or a (methylcyclopentadienyl)trimethylplatinum complex is preferably added. The ultraviolet ray generating source is preferably a high pressure mercury lamp, a medium pressure mercury lamp, an Xe—Hg lamp, a deep UV lamp, or the like. The irradiation amount in this case is preferably 100 to 8,000 mJ/cm2.

The cured product according to the present invention is characteristically obtained by curing the aforementioned curable organopolysiloxane composition. The shape of the cured product is not particularly limited, with examples thereof including a sheet shape, a film shape, and a tape shape. In particular, the curable organopolysiloxane composition has a high curing speed, along with favorable processability for manufacturing a molded product such as a film or the like, such that a cured product having the desired thickness and shape can be efficiently produced.

[Members]

The abovementioned cured product is a gel or elastomer having excellent electric properties and mechanical properties, in addition to having a high specific dielectric constant and mechanical strength (specifically, tensile strength, tear strength, elongation percentage, etc.) Consequently, an electroactive silicone elastomer sheet or electroactive silicone gel sheet obtained by curing this organopolysiloxane composition into a thin film shape can be used as electronic materials, display apparatus members, or transducer members (including members for sensors, speakers, actuators, and generators) and can be particularly suitably utilized as an electroactive film (dielectric layer or electrode layer) configuring the transducer.

[Mechanical Strength]

If the organopolysiloxane cured product obtained by at least partially curing the curable organopolysiloxane composition according to the present invention is heated and molded into a sheet having a thickness of 2.0 mm, it can be designed to have the following dynamic properties measured based on JIS K 6249.

(1) The Young's modulus(MPa) at room temperature can be 10 MPa or less, particularly preferably within a range of 0.1 to 2.5 MPa.

(2) The tear strength (N/mm) at room temperature can be 1 N/mm or higher, particularly preferably within a range of 2 N/mm or higher.

(3) The tensile strength (MPa) at room temperature can be 1 MPa or higher, particularly preferably within a range of 2 MPa or higher.

(4) The elongation at break (%) can be 200% or more, particularly suitably within the range of 200 to 1000% in terms of the displacement amount of the transducer.

[Dielectric Properties]

The organopolysiloxane cured product (elastomer or gel) obtained by curing the curable organopolysiloxane composition according to the present invention can be designed to have the following dielectric properties.

(1) When heated and molded into a shape having a thickness of 0.10 mm, the dielectric breakdown strength (V/μm) can be 20 V/μm or more. The suitable dielectric breakdown strength changes in accordance with the application of the transducer and is particularly suitably within the range of 30 V/μm or more.

(2) When heated and molded into a shape having a thickness of 1 mm, the specific dielectric constant measured under the conditions of a measurement temperature of 25° C. and a measuring frequency of 100 KHz can be 3.0 or more. A preferred dielectric constant can be appropriately set based on the type of transducer and form of required dielectric layer.

The organopolysiloxane cured product obtained by curing or semicuring the curable organopolysiloxane composition according to the present invention can be particularly suitably used as a transducer member selected from artificial muscles, an actuator, a sensor, and a power generation element, in terms of the dielectric properties and dynamic properties thereof. Specifically, the curable organopolysiloxane composition is generally molded into a sheet shape or film shape, then cured by heating or irradiation with high energy rays, etc. While not particularly limited thereto, exemplary methods for molding the curable organopolysiloxane composition into a film shape may include: a method for applying the curable organopolysiloxane composition on a substrate via a conventionally known application method to form a coating film; a molding method via an extruder provided in a predetermined shaped slot; etc.

The thickness of such a film shaped curable organopolysiloxane composition can be, for example, within the range of 0.1 μm to 5,000 μm. The thickness of the obtained cured product may be thinner than the thickness of the applied composition depending on the application method and the presence of a volatile solvent.

Further, the film or sheet of the organopolysiloxane cured product is preferably substantially flat. Specifically, the organopolysiloxane cured product may be a high dielectric film of an organopolysiloxane cured product, where, in the width direction of the film, the difference between the terminal thickness and the central thickness is within 5.0%, while the film center thickness is within a range of 50 to 1000 μm. The film or sheet of such an organopolysiloxane cured product, as well as the manufacturing technique thereof, which has been as proposed in the international patent application (PCT/JP2017/15028) by the present applicants, can also be applied to the organopolysiloxane cured product according to the present invention. A substantially flat transducer member of any thickness can be designed by laminating multiple films or sheets of such a flat organopolysiloxane cured product by the below-mentioned method.

Note that after manufacturing a film shaped curable organopolysiloxane composition via the above mentioned method, while a magnetic field or electric field is optionally applied to this film shaped curable organopolysiloxane composition in the orientation direction of the object dielectric inorganic fine particles or a magnetic field or electric field is optionally applied for a fixed period of time so as to orient a filler, the curable organopolysiloxane composition may then be cured by heat curing, curing at normal temperature, or curing by irradiation with high energy rays. While each curing or curing condition is not particularly limited, if the curable organopolysiloxane composition is an addition curable organopolysiloxane composition, it can be held within the range of 90° C. to 180° C. for 30 seconds to 30 minutes.

If a cured layer obtained by curing the curable organopolysiloxane composition of the present invention is a dielectric layer, particularly a dielectric film member for a transducer such as an actuator or the like, the cured layer is preferably treated as a laminate film that is peelably disposed on a film substrate provided with a release layer capable of releasing a coating.

The release layer may also be referred to as a release liner, a separator, a release layer, or a release coating layer, and may preferably be a release layer having a release coating ability such as a silicone-based release agent, a fluorine-based release agent, an alkyd-based release agent, a fluorosilicone-based release agent, or the like, or it may be formed as a substrate itself which is not prone to adhering to the resin sheet for a pressure sensitive adhesive layer of the present invention by forming physically fine irregularities in the surface of the substrate. In particular, in the laminate body film according to the present invention, a release layer obtained by curing a fluorosilicone release agent is preferably used as the release layer.

While not particularly limited thereto, the thickness of the organopolysiloxane cured product serving as a transducer member is, for example, 1 to 2,000 μm. Here, one layer or two or more layers of the organopolysiloxane cured product according to the present invention is/are laminated; moreover, it may be further configured such that an electrode layer is provided on both ends of the dielectric layer, while the transducer itself including the electrode layer and the dielectric layer is highly laminated. In this case, while the thickness of the organopolysiloxane cured product per one layer is 0.1 μm to 1,000 μm, the thickness may be 0.2 to 2,000 μm by laminating two or more layers of this organopolysiloxane cured product.

While not particularly limited thereto, a method for forming the laminated organopolysiloxane cured layer can be carried out by: (1) a method involving applying the curable organopolysiloxane composition onto the substrate, curing the composition to obtain an organopolysiloxane cured product layer, then further applying the curable organopolysiloxane composition onto the same cured layer, and sequentially repeating curing and application for lamination; (2) a method involving applying the curable organopolysiloxane composition onto the substrate in an uncured or semicured state in a layering manner, then curing the overall different layered coated curable organopolysiloxane composition; and (3) a method involving applying the curable organopolysiloxane composition onto the substrate having a release layer, curing the composition to obtain an organopolysiloxane cured product layer, then separating this cured layer from a release layer, and physically laminating the cured product on a separately similarly prepared organopolysiloxane cured product layer; or (4) combinations of these methods.

In the invention according to the present application, for example, the curable organopolysiloxane composition can be applied to a substrate by die coating to be cured, two or more laminated silicone elastomer cured layers can be formed and the obtained silicone elastomer cured layer can be further adhered to an electrode to be manufactured. In this case, the two or more laminated silicone elastomer cured layers are preferably dielectric layers, while the electrode is preferably a conductive layer.

Die coating is an application system which can realize high speed application and has high productivity. The transducer according to the present invention having a multilayer structure may be manufactured by applying one layer including the organopolysiloxane composition as a single layer, in addition to applying a layer including another organopolysiloxane composition. Moreover, the transducer can be manufactured by simultaneously layering and applying a layer including each organopolysiloxane composition.

An organopolysiloxane cured product serving as a transducer member can be obtained by coating the curable organopolysiloxane composition on a substrate, in addition to curing it at room temperature, under heating or under irradiation with high energy rays such as ultraviolet rays. Moreover, if a thin film shaped dielectric silicone elastomer is layered, an uncured curable organopolysiloxane composition may be coated and sequentially cured on the cured layer or an uncured curable organopolysiloxane composition may be layered and simultaneously cured.

The abovementioned thin film shaped organopolysiloxane cured product is particularly useful as the dielectric layer of the transducer, wherein the transducer can be formed by providing the electrode layer on both ends thereof. Note that conductive inorganic particles may be blended in the curable organopolysiloxane composition according to the present invention so as to impart a function as the electrode layer. Note that in the specification of the present invention, the "electrode layer" may be simply referred to as an "electrode."

One form of the abovementioned transducer member is a thin film that is sheet or film shaped. The film thickness is generally 1 μm to 2,000 μm and includes structures of a single layer, two layers or more, or many more layers laminated. Moreover, if electroactive organopolysiloxane cured product layers which are laminated as required are used as the dielectric layers, they may be 5 μm to 10,000 μm, or a further layered film thickness thereof can be used.

A thin film shaped organopolysiloxane cured product layer serving as this transducer member may be obtained by layering the same thin film shaped silicone elastomer or by layering a thin film shaped silicone elastomer having two or more different physical properties or having different compositions prior to curing. Moreover, the function of the thin film shaped organopolysiloxane cured product layer may be as a dielectric layer or an electrode layer. Specifically, a transducer member which has a thickness of the dielectric layer of 1 to 1,000 μm in addition to having an electrode layer thickness of 0.05 μm to 100 μm is preferably exemplified.

The transducer according to the present invention characteristically has this transducer member obtained by curing the curable organopolysiloxane composition according to the present invention and may specifically have a high lamination structure, that is, a structure including two or more dielectric layers. Further, it may have a structure including three or more dielectric layers. If the transducer having such a high lamination structure includes multiple layers, it can generate greater force. Moreover, a larger displacement can be obtained by lamination than a single layer.

An electrode can be included on both ends of the dielectric layer of the transducer according to the present invention. Examples of the electrode material which can be used include: metals and alloys thereof such as gold, platinum, silver, palladium, copper, nickel, aluminum, titanium, zinc, zirconium, iron, cobalt, tin, lead, indium, chromium, molybdenum, and manganese; metal oxides such as indium-tin composite oxide (ITO), antimony-tin composite oxide (ATO), ruthenium oxide, titanium oxide, zinc oxide, and tin oxide; carbon materials such as carbon nanotubes, carbon nanohorns, carbon nanosheets, carbon fibers, and carbon black; and conductive resins such as poly(ethylene-3,4-dioxythiophene)(PEDOT), polyaniline, and polypyrrole. Conductive resins and elastomers with a conductive filler dispersed in resin may be used.

The electrode may include one of the abovementioned conductive materials independently or two or more thereof. If the electrode includes two or more conductive materials, at least one type is made to function as an active material, in addition to functioning as a conductive material for reducing the resistance of the remaining electrode.

The total thickness of the dielectric layer of the transducer according to the present invention can be within the range of 10 μm to 2,000 μm (2 mm), specifically 200 μm or more. Specifically, the thickness per one layer of a dielectric silicone elastomer forming the dielectric layer is preferably a thickness of 0.1 to 500 μm, particularly preferably 0.1 to 200 μm. When two or more layers of these silicone elastomer layers are laminated, properties such as the dielectric breakdown voltage, dielectric constant, and displacement amount can be improved compared with a single layer.

The transducer in the present invention refers to an element, equipment, or apparatus for converting a certain type of energy to another energy, with examples thereof including: artificial muscles and actuators for converting electric energy to mechanical energy; sensors and power generation elements for converting mechanical energy to electric energy; and speakers, microphones, and headphones for converting electric energy to acoustic energy.

The transducer according to the present invention can be specifically used as the artificial muscles, actuator, sensor, and power generation element in terms of the dielectric and mechanical properties. The application of artificial muscles is anticipated in robots, nursing equipment, rehabilitation equipment, etc. The embodiments of the actuator will hereinafter be described.

FIG. 1 illustrates a cross sectional view of an actuator 1 according to the present embodiment when a dielectric layer is laminated. In the present embodiment, the dielectric layer may be two layers as an example. An actuator 1 includes dielectric layers 10*a* and 10*b*, electrode layers 11*a* and 11*b*, a wiring 12, and a power source 13. Each of the electrode layers 11*a* and 11*b* covers one face of the respectively contacting dielectric layers and is connected to the power source 13 via the wiring 12.

The actuator 1 can be driven by applying a voltage between the electrode layer 11*a* and the electrode layer 11*b*. By applying voltage, the thickness of the dielectric layers 10*a* and 10*b* decreases due to the dielectricity thereof, such that the dielectric layers 10*a* and 10*b* extend in parallel to the faces of the electrode layers 11*a* and 11*b*. That is, electric energy force can be converted to mechanical energy of force, variation, or displacement.

FIG. 2 illustrates a cross sectional view of an actuator 2 according to the present embodiment when a dielectric layer and an electrode layer are laminated. In the present embodiment, three dielectric layers and four electrode layers are used. An actuator 2 includes dielectric layers 20*a*, 20*b* and 20*c*, electrode layers 21*a*, 21*b*, 21*c* and 21*d*, a wiring 22, and a power source 23. Each of the electrode layers 21*a*, 21*b*, 21*c* and 21*d* covers one face of the respectively contacting dielectric layers and is connected to the power source 23 via the wiring 22. The electrode layers are connected to sides having alternately different voltages, wherein the electrode layers 21*a* and 21*c* and the electrode layers 21*b* and 21*d* are connected to respectively different sides.

The actuator 2 can be driven by applying a voltage between the electrode layer 21*a* and the electrode layer 21*b*, between the electrode layer 21*b* and the electrode layer 21*c*, and between the electrode layer 21*c* and the electrode layer 21*d*. By applying voltage, the thickness of the dielectric layers 20*a*, 20*b*, and 20*c* decreases due to the dielectricity thereof, such that the dielectric layers extend in parallel to the faces of the electrode layers 21*a*, 21*b*, 21*c*, and 21*d*. That is, electric energy force can be converted to mechanical energy of force, variation, or displacement.

The embodiments of the actuator as one example of the transducer according to the present invention are as mentioned above. In addition, if mechanical energy such as a pressure is applied from the outside to the transducer according to the present invention, the capacitance between the electrode layers changes along with the deformation of the dielectric layers, enabling the use thereof as a sensor for reading this change. The embodiments of this sensor will hereinafter be described.

FIG. 3 illustrates a view illustrating the configuration of a sensor 3 according to the present embodiment. A sensor 3 has a structure in which a dielectric layer 30 is disposed between the upper electrode layers 31*a*, 31*b* and 31*c* and the lower electrode layers 32*a*, 32*b* and 32*c* which are disposed in a matrix shape. The present embodiment is configured such that the electrode layers are disposed atop three rows of a matrix in the longitudinal direction and in the transverse direction. Each electrode layer can protect the face (not contacting the dielectric layer 30) with an insulating layer. Moreover, the dielectric layer 30 includes two or more layers of the same dielectric layer including an organopolysiloxane.

When external force is applied to the surface of the sensor 3, the thickness of the dielectric layer 30 between the upper electrode layers and the lower electrode layers in the applied region changes, while the capacitance between the electrode layers changes along with this change. For example, the external force can be detected by measuring changes in the voltage caused by changes in the capacitance between these electrode layers.

Note that in the sensor 3 according to the present embodiment, three pairs of electrode layers which face each other via the dielectric layer are formed, wherein the number, size, and arrangement, etc. of the electrode layers can be appropriately determined in accordance with the application.

The power generation element is a transducer for converting mechanical energy to electric energy and can be applied to apparatuses for generating power using vibration, impact, and pressure changes, with the power generation including wave power, water power, and natural energy such as water power. The embodiments of this power generation element will hereinafter be described.

FIG. 4 illustrates a cross sectional view of a power generation element 4 according to the present embodiment when a dielectric layer is laminated. In the present embodiment, the dielectric layer may be two layers as an example. A power generation element 4 includes dielectric layers 40*a* and 40*b*, along with electrode layers 41*a* and 41*b*, wherein the electrode layers 41*a* and 41*b* cover one face of respectively contacting dielectric layers.

The electrode layers 41*a* 41*b* are electrically connected to a load (not illustrated), the present power generation element 4 changes the distance between the electrode layers 41*a* 41*b*, thereby changing the capacitance to generate electric energy. That is, the element shape is changed such that the electrode layers 41*a* 41*b* are electrostatically induced by an electrostatic field (formed by the dielectric layers 40*a* and 40*b*) so as to generate power.

In the present embodiment, when the state changes from a state (upper figure) in which compression force is applied in the direction parallel to the faces of the electrode layers 41*a* and 41*b* of the power generation element 4 illustrated in FIG. 4 to a state (lower figure) in which the compression force illustrated in the figure is not applied, for example, the capacitance between the electrode layers 41*a* 41*b* can change so as to convert mechanical energy to electric energy. Moreover, a power generation apparatus can be configured such that multiple elements are disposed on a substrate and connected in series or in parallel to improve the power generation amount.

The transducer according to the present invention can operate in air, water, vacuum, and an organic solvent. Moreover, sealing treatment may be appropriately carried out in accordance with the usage environment. While not particularly limited thereto, examples thereof include the sealing method with a resin material, etc.

INDUSTRIAL APPLICABILITY

The curable organopolysiloxane composition of the present invention and a cured product obtained by curing the composition can be preferably used for applications in which an elastomer or gelled member having excellent dynamic properties and electric properties is required, for example, the manufacture of a transducer. The curable organopolysiloxane composition according to the present invention partially reacts with an uncured curable composition, as well as reactive organopolysiloxane, but includes a so-called B stage material not reaching curing in the state during curing. Exemplary B stage materials according to the present invention include those in a state of gelation or fluidity. Therefore, the aspects of the present invention include a transducer member in a state of gelation or fluidity in the state in which the curing reaction of the curable organopolysiloxane composition partially proceeds. Moreover, such a semicured transducer member may have a structure in which the thin film shaped organopolysiloxane cured product is used as one layer or laminated.

Specifically, the abovementioned cured product is a gel or elastomer having excellent electric properties and mechanical properties, in addition to having a high specific dielectric constant and mechanical strength (specifically, tensile strength, tear strength, elongation percentage, etc.). Consequently, an electroactive silicone elastomer sheet or electroactive silicone gel sheet obtained by curing this organopolysiloxane composition into a thin film shape can be suitably utilized for an electroactive film (dielectric layer or electrode layer) configuring the transducer. For example, they are useful as transducer materials proposed by the present applicants in Patent Document 1 or 2. In addition, they can be applied to transducer apparatuses using dielectric elastomers other than silicone without particular limitations, wherein a portion or all of a dielectric elastomer layer can be designed in place of the abovementioned cured product. A large number of structures of such a transducer (including the actuator) have been proposed, with examples thereof as International Patent Publications including WO2011/118315, with examples thereof as Japanese Unexamined Patent Application Publications including JP 2008-533973 W, JP 2001-524278 W, JP 2008-187079 A, JP 2008-277729 A, JP 2009-59856 A, JP 2009-219302 A, JP 2012-65427 A, JP 2016-226258 A, JP 2017-064836 A, etc. Note that the structural design or design changes associated with the substitution of a portion or all of the dielectric elastomer layer with the abovementioned cured product can be responded to via normal creation by those skilled in the art, with the present invention strongly suggesting such creation.

Similarly, the abovementioned cured product can be utilized in place of an electrolyte layer or dielectric layer in an actuator element structure known as a so-called "polymer actuator" or "polymer actuator." Specifically, a portion or all of an electrolyte layer can be substituted and utilized in a polymer actuator which has: the electrolyte layer (including an electrolyte layer in which an ionic liquid is contained in a polymer); and an electrode layer formed in the electrolyte layer, and deforms in accordance with the voltage applied to the electrolyte layer. Note that a large number of structures of such a polymer actuator have been proposed, with examples thereof as International Patent Publications including WO 10/100907, WO 10/110417, WO 11/114965, WO 10/029992, WO 13/118628, and WO 14/104331, with examples thereof as Japanese Unexamined Patent Application Publications including JP 2004-282992 A, JP 2008-251697 A, JP 2010-003553 A, JP 2012-055153 A, JP 2013-255397 A, JP 2013-106491 A, JP 2013-251942 A, JP 2015-126597 A, JP 2015-186301 A, JP 2016-189651 A, etc. Note that organopolysiloxane cured products according to the present invention can be designed in the desired shape in an elastomer or gel unlike electrolytes and are useful for structure designs particularly requiring lamination or a high displacement amount. Therefore, in the existing polymer actuator, structure designs or design changes which reflect the abovementioned mechanical properties and dielectric properties can be responded to via normal creation by those skilled in the art, with the present invention strongly suggesting such creation.

Other applications of the fluoroalkyl group-containing curable organopolysiloxane composition and a cured product obtained by curing the same according to the present invention are in no way limited to the disclosure above, with a dielectric layer film provided with a cured product obtained by curing the fluoroalkyl group-containing curable organopolysiloxane composition according to the present invention capable of being used in various flat panel displays (FPDs) for displaying characters, symbols, and images such as television receivers, computer monitors, monitors for personal digital assistants, surveillance monitors, video cameras, digital cameras, mobile phones, personal digital assistants, displays for instrument panels of automobiles or the like, displays for instrument panels of various equipment, devices, and instruments, automatic ticket machines, and automated teller machines. Application is possible as a device for CRT displays, liquid crystal displays, plasma displays, organic EL displays, inorganic EL displays, LED displays, surface electrolytic displays (SEDs), field emitting displays (FEDs), and other displaying devices, or touch panels using the displaying devices. The film according to the present invention may be used for the purpose of scratch prevention, stain prevention, fingerprint adhesion prevention, static prevention, glare prevention, peep prevention, and the like of these display surfaces.

EXAMPLES

The present invention will be described below by way of examples; however, the present invention is not limited thereto. The following compounds were used in the examples shown below.

- Component (a1-1): Dimethylsiloxane polymer (amount of vinyl groups: 0.22 mass %, siloxane polymerization degree: 335) blocked at both ends with a vinyldimethylsiloxy group
- Component (a1-2): Dimethylsiloxane polymer (amount of vinyl groups: 0.14 mass %, siloxane polymerization degree: 538) blocked at both ends with a vinyldimethylsiloxy group
- Component (a2): Dimethylsiloxane polymer (amount of vinyl groups (mass %): 0.09 mass %, siloxane polymerization degree: 835) blocked at both ends with a vinyldimethylsiloxy group
- Component (b1): Fumed silica treated with hexamethyldisilazane, divinyltetramethyldisilazane, and a siloxane polymer blocked at both ends with a hydroxydimethylsiloxy group, having a dimethyl siloxy unit and vinyl methylsiloxy unit (vinyl group weight % is approximately 11) (Pre-treatment product name: CAB-O-SIL® MS75D)
- Component (b2): Fumed silica treated with hexamethyldisilazane (Pre-treatment product name: CAB-O-SIL® MS75D)
- Component (c): MQ resin containing a vinyl group (vinyl group content: 1.60 mass %) configured from a trimethylsiloxy unit (M), a vinyl dimethyl siloxy unit (ViM), and a tetrafunctional siloxy unit (Q, $SiO_{4/2}$) unit
- Component (d): Dimethylsiloxy-methylhydrosiloxy-siloxane copolymer blocked at both ends by a trimethylsiloxy group (amount of silicon-bound: 0.70 mass %).
- Component (e): Dimethyl siloxane polymer solution blocked at both ends by a vinyl dimethyl siloxy group (approximately 0.6 wt % in platinum concentration) of a platinum-1,3-divinyl 1,1,3,3-tetramethyldisiloxane complex <Hydrosilylation Reaction Inhibitor>

- Component (f): 1,3,5,7-tetramethyl-1,3,5,7-tetravinyl-cyclotetrasiloxane

Examples 1 to 9 and Comparative Examples 1 to 5

Table 1 (Examples) and Table 2 (Comparative Examples) show the composition of each experimental example. The numerical value corresponding to each component is in mass %, and the sum thereof is 100 mass %. Furthermore, silicon atom-bonded hydrogen atoms (Si—H) of component (d) serving as a crosslinking agent per one mol of vinyl groups in the composition were used at an amount within a range of 1.3 to 2.0 mols, in the following examples. Furthermore, Tables 1 and 2 show the physical properties before or after curing measured by the following methods.

[Viscosity of Composition Before Curing]

The viscosity before curing of each composition was measured using a viscoelasticity measuring device (manufactured by Anton Paar, model number MCR102). Measurements were performed using a 20 mm diameter, 2° cone—plate with different shear rates. The overall viscosities of the compositions measured at 25° C. and shear rates of 0.1 ($S^{-1}$) and 10.0 ($S^{-1}$) were recorded, respectively.

[Measurement of Physical Properties of Cured Product]

The compositions were press cured at 150° C. for 15 minutes, then further post cured at 150° C. for 60 minutes to 120 minutes in an oven to obtain a cured product. The tear strength of the obtained cured product was measured based on JIS-K6249, while the tensile strength and the elongation at break were measured to obtain the Young's modulus (modulus). Note that in order to measure mechanical strength, the thickness of the sheet was set to 2 mm. Moreover, the durometer A hardness of a sheet having a thickness of 6 mm was measured.

Moreover, a sheet having a thickness of approximately 0.1 mm was manufactured under the abovementioned conditions to measure the dielectric breakdown strength using an electric insulating oil breaking voltage test apparatus of PORTATEST 100A-2 produced by Soken Electric Co., Ltd. A total of 10 points were measured for each cured product sheet, and intermediate values thereof are shown in the table. Similarly, a sheet having a thickness of 1 mm was manufactured, after which the specific dielectric constant was measured at a temperature of 25° C. at a frequency within the range of 20 Hz to 1 MHz with an LCR meter of 6530P/D2 produced by Wayne Kerr. The value of the dielectric constant at 100 KHz of the cured product sheets in the Examples and Comparative Examples 3 to 5 was 3.

Comparative Examples 1 to 5

Using components other than (B1), the curable organopolysiloxane composition was prepared in the composition indicated in Table 2, similar to the examples, to perform the aforementioned various measurements.

TABLE 1

| | Example No. | | | | | | | | |
|---|---|---|---|---|---|---|---|---|---|
| | 1 | 2 | 3 | 4 | 5 | 6 | 7 | 8 | 9 |
| Component (a1-1) | 37.05 | 40.49 | 41.81 | 43.35 | 43.99 | 34.25 | 27.56 | 27.88 | 33.41 |
| Component (a1-2) | | | | | | | | | |
| Component (a2) | 41.01 | 38.56 | 36.95 | 35.05 | 35.56 | 45.39 | 51.06 | 50.70 | 43.59 |
| Component (b1) | 5.94 | 5.94 | 5.94 | 5.94 | 5.94 | 5.94 | 5.94 | 7.02 | 5.94 |
| Component (b2) | 13.05 | 12.00 | 10.50 | 9.00 | 9.00 | 9.00 | 9.00 | 7.92 | 14.16 |
| Component (c) | | | 1.47 | 2.94 | 2.94 | 2.94 | 2.94 | 2.94 | |
| Component (d) | 2.55 | 2.61 | 2.93 | 3.32 | 2.17 | 2.08 | 3.10 | 3.14 | 2.50 |
| Component (e) | 0.30 | 0.30 | 0.30 | 0.30 | 0.30 | 0.30 | 0.30 | 0.30 | 0.30 |

TABLE 1-continued

| | Example No. | | | | | | | | |
|---|---|---|---|---|---|---|---|---|---|
| | 1 | 2 | 3 | 4 | 5 | 6 | 7 | 8 | 9 |
| Component (f) | 0.10 | 0.10 | 0.10 | 0.10 | 0.10 | 0.10 | 0.10 | 0.10 | 0.10 |
| SiH/Vi | 2.0 | 2.0 | 2.0 | 2.0 | 1.3 | 1.3 | 2.0 | 2.0 | 2.0 |
| {(a1-1) + (a1-2)}/(a2) | 0.90 | 1.05 | 1.13 | 1.24 | 1.24 | 0.75 | 0.54 | 0.55 | 0.77 |
| (b) + (c) mass % | 18.89 | 17.85 | 17.83 | 17.80 | 17.80 | 17.80 | 17.80 | 17.80 | 20.00 |
| (C) mass % | 0.00 | 0.00 | 1.47 | 2.94 | 2.94 | 2.94 | 2.94 | 2.94 | 0.00 |
| Viscosity 0.1 1/s(Pas) | 67.7 | 61.9 | 43.0 | 35.2 | 35.1 | 50.8 | 67.6 | 64.7 | 112.3 |
| Viscosity 10 1/s (Pa s) | 38.5 | 37.5 | 29.1 | 26.0 | 26.5 | 37.6 | 47.7 | 45.3 | 52.3 |
| Hardness (shore A) | 33 | 33 | 35 | 37 | 35 | 34 | 35 | 36 | 33 |
| Tensile strength (MPa) | 3.8 | 3.8 | 3.6 | 4.4 | 3.5 | 4.1 | 5.3 | 5.0 | 3.3 |
| Elongation (%) | 345 | 338 | 297 | 292 | 259 | 266 | 366 | 333 | 319 |
| Young modulus (MPa) | 0.8 | 0.8 | 0.9 | 0.9 | 0.8 | 0.9 | 0.9 | 1.0 | 0.8 |
| Tear strength (N/mm$^2$) | 12.4 | 8.6 | 10.0 | 9.8 | 6.5 | 9.5 | 9.2 | 9.5 | 15.2 |
| Dielectric breakdown strength (V/μm) | 54.0 | 55.9 | 63.1 | 60.0 | 57.3 | 55.6 | 61.8 | 63.2 | 57.8 |

TABLE 2

| | Comparative Example No. | | | | |
|---|---|---|---|---|---|
| | 1 | 2 | 3 | 4 | 5 |
| Component (a1-1) | 11.20 | | 46.12 | 46.10 | 46.99 |
| Component (a1-2) | 11.20 | | | | |
| Component (a2) | 55.71 | 78.34 | 31.58 | 32.71 | 33.11 |
| Component (b1) | 5.94 | 5.94 | 5.94 | 5.94 | 5.94 |
| Component (b2) | 14.16 | 14.16 | 6.00 | 6.72 | 6.72 |
| Component (c) | | | 5.88 | 4.41 | 4.41 |
| Component (d) | 1.59 | 1.36 | 4.08 | 3.72 | 2.43 |
| Component (e) | 0.10 | 0.10 | 0.30 | 0.30 | 0.30 |
| Component (f) | 0.10 | 0.10 | 0.10 | 0.10 | 0.10 |
| SiH/Vi | 2.0 | 2.0 | 2.0 | 2.0 | 1.3 |
| {(a1) + (a2)}/(a2) | 0.40 | 0.00 | 1.46 | 1.41 | 1.42 |
| (b) + (c) mass % | 20.00 | 20.00 | 17.76 | 17.00 | 17.01 |
| (C) mass % | 0.00 | 0.00 | 5.88 | 4.41 | 4.41 |
| Viscosity 0.1 1/s(Pa s) | 172.1 | 360.2 | 23.3 | 27.5 | 29.5 |
| Viscosity 10 1/s (Pa s) | 90.5 | 199.0 | 19.5 | 22.5 | 23.9 |
| Hardness (shore A) | 28 | 30 | 41 | 39 | 36 |
| Tensile strength (MPa) | * | * | 5.5 | 4.9 | 4.1 |
| Elongation (%) | * | * | 269 | 257 | 319 |
| Young modulus (MPa) | * | * | 1.1 | 1.1 | 0.8 |
| Tear strength (N/mm2) | * | * | 3.4 | 3.5 | 3.3 |
| Dielectric breakdown strength (V/μm) | * | * | 65.4 | 61.8 | 64.5 |

* Properties other than hardness were not measured for Comparative Examples 1 and 2 because the compositions were highly viscous and film processability was not favorable.

SUMMARY

As described above, in Examples 1 to 9, it was confirmed that the compositions are preferable for various transducer applications including actuators, because the compositions have low viscosity before curing, excellent film processability, and cured products thereof have remarkably excellent mechanical properties such as tear strength, tensile strength, elasticity, and the like. On the other hand, if components (A1)/(A2) are not used at a predetermined ratio, as in Comparative Examples 1 and 2, the viscosity of the composition before curing is high, and thus practicality is reduced. Furthermore, in other known compositions or compositions that do not meet the requirements of the present invention, the physical properties of the cured product, including tear strength, are such that it cannot be used sufficiently as an electroactive film or electroactive sheet for various transducer applications such as actuators.

The cured products obtained using the curable organopolysiloxane compositions of the Examples of the present invention can design various hardness/Young's modulus cured products as desired, in addition to high electrical properties, and thus can be widely used.

DESCRIPTION OF THE REFERENCE NUMERALS

1, 2 Actuator
10*a*, 10*b*, 20*a*, 20*b*, 20*c* Dielectric layer
11*a*, 11*b*, 21*a*, 21*b*, 21*c*, 21*d* Electrode layer (conductive layer)
12, 22 Wiring
13, 23 Power supply
3 Sensor
30 Dielectric layer
31*a*, 31*b*, 31*c* Upper electrode layer
32*a*, 32*b*, 32*c* Lower electrode layer
4 Power generation element
40*a*, 40*b* Dielectric layer
41*a*, 41*b* Electrode layer

The invention claimed is:

1. A curable organopolysiloxane composition, the composition comprising:

(A1) a straight chain or branched organopolysiloxane having an alkenyl group only at an end of a molecular chain and a degree of siloxane polymerization within a range of 50 to 550;

(A2) a straight chain or branched organopolysiloxane having an alkenyl group only at an end of a molecular chain and a degree of siloxane polymerization within a range of 600 to 1000;

(B) hydrophobically treated reinforcing silica;

(C) optionally, an organopolysiloxane resin containing an alkenyl group having at least one branched siloxane unit in a molecule with an amount of vinyl ($CH_2$═CH—) groups within a range of 1.0 to 5.0 mass %;

(D) an organohydrogenpolysiloxane having at least three silicon atom-bonded hydrogen atoms in a molecule; and (E) an effective amount of a hydrosilylation reaction catalyst;

wherein:

the mass ratio of component (A1) to component (A2) ((A1)/(A2)) is within a range of 0.45 to 1.30, the sum of the components (B) and (C) is within a range of 10 to 25 mass % of the entire composition, the mass ratio of component (C) to the sum of components (B) and (C) ((C)/{(B)+(C)}) is within a range of 0 to 0.2, and the sum of silicon atom-bonded hydrogen atoms in component (B) is an amount of from 0.1 to 2.5 mol with respect to the total amount of 1 mol of an alkenyl group in the composition.

2. The curable organopolysiloxane composition according to claim 1, wherein the overall viscosity of the composition measured at a shear rate of 0.1 ($S^{-1}$) using a rotational viscometer at 25° C. is within a range of 10 to 150 Pa·s, and the overall viscosity of the composition measured at a shear rate of 10.0 ($S^{-1}$) is within a range of 10 to 75 Pa·s.

3. The curable organopolysiloxane composition according to claim 1, wherein component (B) is fumed silica that has been surface treated with a hydrophobizing treatment agent containing an organosilicon compound containing an alkenyl group.

4. The curable organopolysiloxane composition according to claim 1, wherein an organic solvent is not included.

5. A transducer member formed from the curable organopolysiloxane composition according to claim 1.

6. A cured product comprising a cured reaction product of the curable organopolysiloxane composition according to claim 1.

7. An electroactive film or electroactive sheet having a thickness of from 1 to 200 μm, wherein the electroactive film or electroactive sheet comprises a cured reaction product of the curable organopolysiloxane composition according to claim 1.

8. A member for a transducer, which is in the form of a film or sheet, wherein the member comprises a cured reaction product of the curable organopolysiloxane composition according to claim 1.

9. An electronic material or a displaying device member, which is in the form of a film or sheet, wherein the film or sheet comprises a cured reaction product of the curable organopolysiloxane composition according to claim 1.

10. A member for a transducer, which is a gel or elastomer, wherein the gel or elastomer comprises a cured reaction product of the curable organopolysiloxane composition according to claim 1.

11. A transducer, comprising a dielectric layer obtained by curing the curable organopolysiloxane composition according to claim 1.

12. A transducer, wherein an intermediate layer, which is obtained by at least partially curing the curable organopolysiloxane composition according to claim 1, is interposed between at least a pair of electrode layers.

13. The transducer according to claim 12, wherein the intermediate layer is a gel or elastomer.

14. The transducer according to claim 12, wherein the intermediate layer is obtained by laminating one or more layers of a cured product obtained by curing the curable organopolysiloxane composition.

15. The transducer according to claim 11, wherein the transducer is an actuator.

16. The curable organopolysiloxane composition according to claim 1, wherein component (C) is present in the composition and wherein the mass ratio of component (C) to the sum of components (B) and (C) ((C)/{(B)+(C)}) is from greater than 0 to 0.2.

* * * * *